United States Patent [19]

Maruyama et al.

[11] Patent Number: 5,050,122
[45] Date of Patent: Sep. 17, 1991

[54] BLOCH LINE MEMORY DEVICE AND METHOD FOR OPERATING SAME

[75] Inventors: Youji Maruyama; Ryo Suzuki, both of Hachioji, Japan

[73] Assignee: Hitachi, Ltd., Tokyo, Japan

[21] Appl. No.: 16,656

[22] Filed: Feb. 19, 1987

[30] Foreign Application Priority Data

Feb. 28, 1986 [JP] Japan .................................. 61-41776

[51] Int. Cl.⁵ .............................................. G11C 19/08
[52] U.S. Cl. .......................................... 365/29; 365/87
[58] Field of Search .................................... 365/29, 87

[56] References Cited

U.S. PATENT DOCUMENTS 4,001,794  1/1977  Voeyeli ................................ 365/29
4,583,200  4/1986  Konishi et al. ...................... 365/29

FOREIGN PATENT DOCUMENTS 59101092  6/1984  Japan ................................... 365/29

OTHER PUBLICATIONS

IEEE Transactions on Magnetics, vol. Mag.-21, No. 5, Sep. 1985, pp. 1762-1766.
IEEE Trans. on Magnetics, Mag. 19, No. 5 Sep. (1983) pp. 1838-1840; pp. 1841-1843.
Electronic Product Design' Oct. 1985, pp. 69-72.

Primary Examiner—James W. Moffitt
Attorney, Agent, or Firm—Antonelli, Terry, Stout & Kraus

[57] ABSTRACT

There are disclosed techniques concerning reading out Bloch lines in a Bloch line memory device, where pairs of Bloch lines are used as an information carrier. The pairs of Bloch lines are transferred to the head portion of a stripe magnetic domain and an inplane magnetic field is applied at the proximity of the head portion of the stripe magnetic domain so that the pairs of Bloch lines are split. In this way only one of the Bloch lines can exist stably at the head portion of the stripe magnetic domain. Then the Bloch lines are transformed into a magnetic bubble domain by making electric current to flow through a hair-pin shaped conductor disposed at the proximity of the head portion of the stripe magnetic domain. This magnetic bubble domain is detected by a magnetic bubble detector.

16 Claims, 10 Drawing Sheets

BLOCH LINE MEMORY DEVICE AND METHOD FOR OPERATING SAME

BACKGROUND OF THE INVENTION

This invention relates to a Bloch line memory device and a method for operating same and in particular to a Bloch line memory device and a method for operating same, which are suitable for obtaining a good read-out margin and practical.

Figure 1:
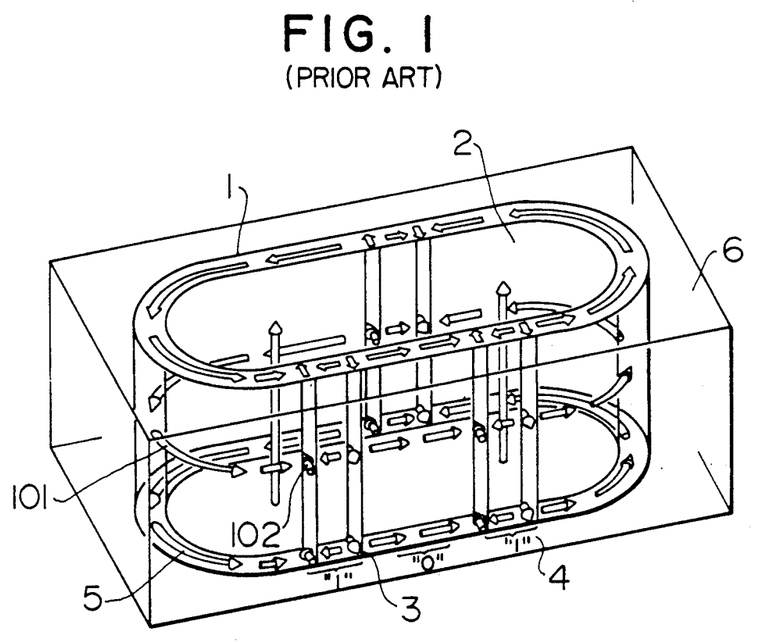
FIG. 1 is a perspective view showing a stripe magnetic domain and Bloch line existing on its domain wall.

In a Bloch line memory device a magnetic garnet film is used as a memory medium film as in a magnetic bubble memory device. However their memory methods are considerably different. That is, in a Bloch line memory the presence and the absence of a vertical Bloch line pair existing in the wall around a stripe magnetic domain obtained by stretching a bubble correspond to "1" and "0", respectively, while in a prior art magnetic bubble memory the presence and the absence of a bubble correspond to "1" and "0" in data. FIG. 1 indicates this aspect. In the figure, the arrow directed upward in a stripe magnetic domain 2 shows the direction of magnetization; arrows 101 on the center line of the wall 1 show the direction of magnetization located at the wall center; and arrows 102 perpendicular to the wall 1 at the center line show the direction of magnetization at the center of the vertical Bloch line (hereinbelow called merely Bloch line). Further, portions, where a pair of Bloch lines exist, correspond to "1" in data and portions, where no Bloch lines exist, correspond to "0".

The Bloch line used as an information carrier is a microstructure of the domain wall existing in the wall 1 surrounding the magnetic domain. The Bloch line can exist stably in the domain wall and propagate freely along the domain wall. Consequently, when a number of stripe magnetic domains are arranged at their predetermined positions and Bloch lines are made to exist in the domain wall, they behave just as bubbles propagating in a minor loop of a magnetic bubble memory. For this reason a Bloch line memory is a shift register type memory similarly to a magnetic bubble memory.

The existence of the Bloch line is known since long ago and it is verified by experiments and their analysis that the mobility of the magnetic domain is reduced by the existence of the Bloch line. Consequently, for the magnetic bubble memory, for which the magnetic domain should be shifted, the bubble domain containing Bloch lines is called a hard bubble and attempts have been made to prevent its generation. To the contrary, for the Bloch line memory device, the existence of this Bloch line is positively utilized.

The physical size of the Bloch line is about 1/10 of the width of the stripe magnetic domain, where the Bloch line exists, and a number of Bloch lines can exist in one stripe magnetic domain. For example, at present, in a garnet film having stripe magnetic domains 1 $\mu$m wide developed for a magnetic bubble memory it is possible to make about $5 \times 10^6$ Bloch lines exist per 1 cm$^3$. Therefore, in the case where 2 Bloch lines are paired in the information medium, it is possible to realize a memory of 256M bit/cm$^2$.

Furthermore there is another reason why a Bloch line memory device can have a large memory capacity, apart from the fact that the size is extremely small. It is due to the fact that in the Bloch line memory the magnetic field in the vertical direction is used for the propagation of information, while in the magnetic bubble memory information carriers are propagated by rotating an in-plane field. For this reason there is a high possibility that the propagation pattern is simplified in a plane, which acts so as to make it easier to increase the density for this type of memory elements.

As described above, vertical Bloch lines in the garnet film are movable in the domain wall and can work as information carriers. However, in order to realize a memory element, it is necessary to write-in and read-out information, if necessary. The write-in operation is effected basically by making electric current flow through a conductor disposed at the proximity of one stripe domain head so that a local magnetic field is generated there and reversing the direction of magnetization in the domain wall. That is, it can be thought that the direction of magnetization indicated by "0" in FIG. 1 is reversed so that it is in accordance with the direction of magnetization in the "1" domain. At this time, at the boundary between the domain wall, where the direction of magnetization is reversed and the domain wall, where it is not reversed, the direction of magnetization varies continuously and a state where the magnetization has changed by 90° with respect to the domain wall is established. Bloch lines are produced in this way. Further two Bloch lines are always paired. Consequently the Bloch line memory is constituted by making one pair of Bloch lines correspond to one information.

Figure 2A:
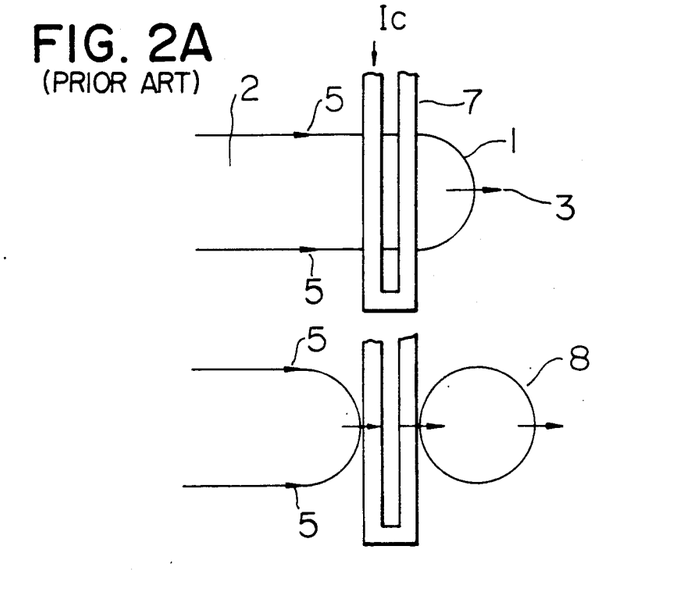
FIGS. 2A and 2B are schemes for explaining the principle of the prior art techniques for transforming the presence or absence of the Bloch lines into the presence or absence of the magnetic bubble domain.
Figure 2B:
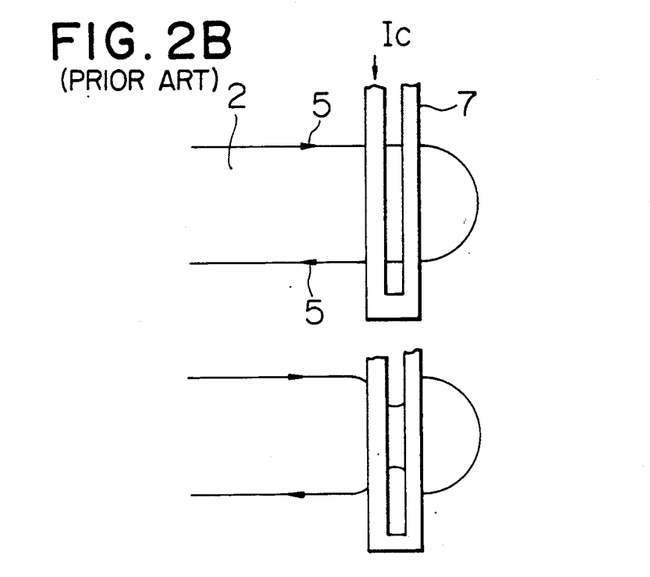

The read-out of information is effected, after having transformed the presence or absence of the Bloch line into the presence or absence of the bubble domain. The transformation of the Bloch line into the bubble domain is effected by the method described by Konishi in an article published in IEEE Trans. Mag. 19, No. 5 (1983) p. 1838–p. 1840 and p. 1841–p. 1843. That is, when a pair of Bloch lines exist, the direction of magnetization in the domain wall is reversed at the pair of Bloch lines as a border, as indicated in FIG. 1. When a pair of Bloch lines arrive at the stripe magnetic domain head, variations in this magnetization structure give rise to variations in chopping properties. Therefore, when a proper chopping condition is selected, it is possible to chop a bubble 8, only when a pair of Bloch lines exist at the stripe magnetic domain head. When the chopped bubble 8 is propagated to a detector as in the major line of a bubble memory and transformed into electric signals, the existence of the pair of Bloch lines can be read-out. FIG. 2 is a top view of the element indicated in FIG. 1, in which also the direction of magnetization seen from above is indicated by arrows.

The principle of the transformation of the pair of Bloch lines into a magnetic bubble domain will be explained in detail, referring to FIGS. 2A and 2B. When a predetermined electric current is made to flow through a hair-pin shaped conductor 7 superposed on the stripe magnetic domain 2, as indicated in FIG. 2A, so that a magnetic field is applied to the gap of the conductor 7 in the collapse direction, the domain walls 1 at both the sides of the stripe magnetic domain approach each other. Noticing the magnetizations 5 of the domain walls, which have approached each other, it can be seen that the magnetizations have a same direction at the upper and the lower side of the domain wall, because the magnetizations are inverted to each other at the boundary formed by the pair of Bloch lines. For this reason influences of the exchange interaction acting on the magnetizations 5 are small and the domain walls are combined by a weak magnetic field in the collapse direction. As the result a new magnetic bubble domain 8 is generated. In this case the chopping of the Bloch lines is easy.

To the contrary, in the case indicated in FIG. 2B, where no Bloch lines exist, the magnetizations 5 are not reversed because of the absence of the Bloch lines and thus the magnetizations are opposite to each other at the upper and the lower side of the domain wall. Therefore, even if a chopping operation is effected, influences of the exchange interaction acting on the magnetizations are remarkable and thus it is difficult to combine the sides of the domain wall. For this reason no magnetic bubble domain is chopped, i.e. the chopping of the Bloch lines is difficult.

In order to detect whether the chopping of the Bloch lines described above is easy or difficult, it is necessary to set the intensity of the magnetic field in the collapse direction in a certain region. That is, if the magnetic field is too strong, the head portion of the stripe magnetic domain is chopped and to the contrary, if it is too weak, no magnetic domain is chopped, even if a pair of Bloch lines exist at the head portion. Consequently the intensity of the magnetic field should be selected in this region. For this selection it is sufficient to select an intensity of the electric current. A concrete example is shown here. For a material having stripe magnetic domains 5 μm wide, supposing that the gap between the conductors is 5 μm, when the intensity of the electric current is in a region between about 120 and 150 mA, the presence or absence of the Bloch lines can be transformed into the presence or absence of the bubble.

It is possible to realize a Bloch line memory by forming a write-in, a memory and a read-out function portion described above in one element.

Figure 3A:
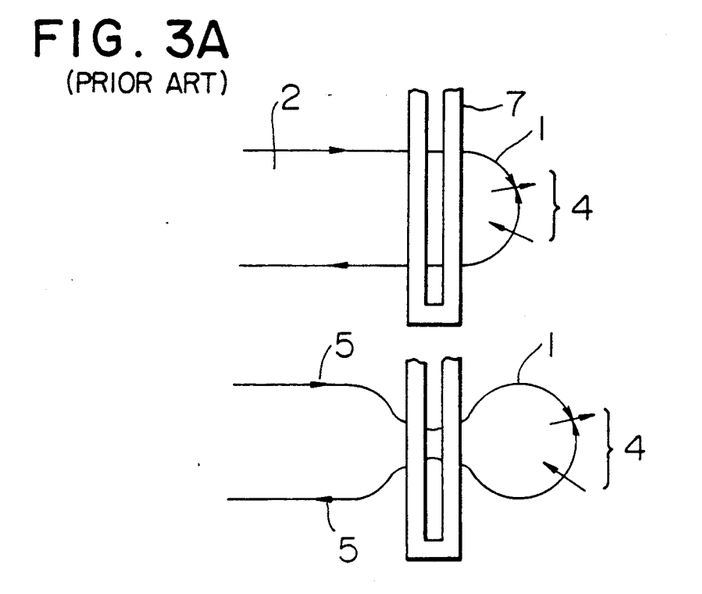
FIGS. 3A and 3B are schemes for explaining problematical points, in the case where the presence or absence of the Bloch lines is transformed into the presence or absence of the magnetic bubble domain according to the prior art techniques.
Figure 3B:
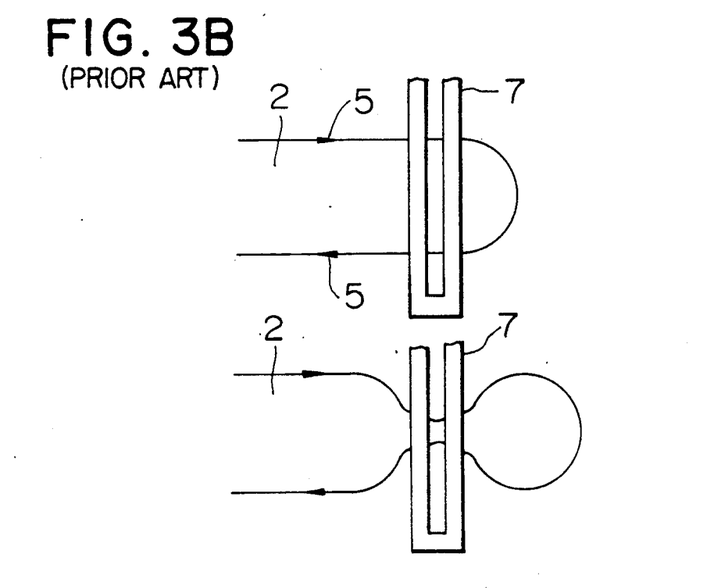

As described above, an information in the Bloch line memory is represented by the presence or absence of a pair of Bloch lines. Consequently, in a practical memory device it is necessary to transform the presence or absence of the pair of Bloch lines into the presence or absence of the bubble. FIG. 3A indicates a case where a pair of Bloch lines 4 arrive at the head portion of a stripe magnetic domain 2 and on the other hand FIG. 3B indicates a case where there are no pair of Bloch lines. In the two states, comparing the directions of the magnetizations 5 of the domain wall 1, it can be seen that the two are the same. That is, it can be understood that the direction of the magnetization of the domain wall varies, depending on whether Bloch lines exist or not, but the direction of the magnetization doesn't vary, depending on whether a pair of Bloch lines exist or not. This reason is that the direction of the magnetization reversed by one Bloch line is reversed again by the other Bloch line so that the direction of the magnetization returns finally to the initial one. For this reason, since the direction of the magnetizations 5 doesn't vary depending on the presence or absence of the pair of Bloch lines, it can be understood that its presence or absence cannot be transformed into the presence or absence of the magnetic bubble domain by the prior art method utilizing only a hair-pin shaped conductor 7 in FIG. 2.

As measures for resolving this problem a method is disclosed in JP-A-59-101092. By this method electric current is made to flow through a conductor superposed on the chopping conductor so that the position of the pair of Bloch lines is held and reading-out is carried out by effecting the chopping operation between the pair of Bloch lines. According to this method the presence or absence of the pair of Bloch lines can be transformed into the presence or absence of the bubble domain and thus the reading-out according to the prior art techniques is realized. However it is not possible to obtain any satisfactory working margin only by this method. That is, since the distance between the pair of Bloch lines is about 0.2 time as large as the width of the stripe magnetic domain, it is almost impossible to dispose the chopping conductor therebetween.

Further, since the pair of Bloch lines existing on the side surface of the stripe magnetic domain are read-out by this method, there are two read-out positions on the sides of th domain wall, which are opposite to each other. In addition, this method has another disadvantage that when the magnetic domain is chopped at the reading-out, the information existing at the head portion of the stripe magnetic domain is lost.

As another article on the Bloch line memory device, refer to Electronic Product Design, Oct. 1985, p. 69-p. 72.

SUMMARY OF THE INVENTION

The object of this invention is to provide a practical Bloch line memory device, in which a pair of Bloch lines represent one bit information and a method for operating same.

As indicated above, it is not possible to detect the presence or absence of information, if one bit information is chopped at once at the reading-out.

On the basis of this knowledge the problem described above is resolved and the reading-out operation can be effected, if the pair of Bloch lines corresponding to one bit information are split and only one of the Bloch lines thus split is chopped.

Furthermore it is possible to realize the conservation of the information existing at the head portion of the stripe magnetic domain by effecting the above operation at the head portion of the stripe magnetic domain.

A Bloch line memory device according to this invention is constructed as follows, in order to transform a pair of Bloch lines located at the head portion of the stripe magnetic domain into a magnetic bubble domain.

That is, the pair of Bloch lines have domain walls surrounded by the pair therebetween. According to this invention means for applying an in-plane magnetic field having a component, which is approximately parallel to the direction of magnetization that the domain walls have, is disposed at the proximity of the head portion of the stripe magnetic domain. The direction of this in-plane magnetic field is so determined that it is parallel and opposite e.g. to the direction, along which the stripe magnetic domain stretches (Y axis direction). By the application of this in-plane magnetic field a force tending to make the magnetic energy small acts on the region surrounded by the pair of Bloch lines. Consequently the region is enlarged by this force and the distance between the two Bloch lines forming the pair of Bloch lines increases.

In this way one of the Bloch lines becomes more distant from the head portion of the stripe magnetic domain and the other is held stably at the head portion of the stripe magnetic domain.

Further a stripe magnetic domain chopping means disposed at the proximity of the head portion of the stripe domain chops the stripe magnetic domain, leaving the state in which the in-plane magnetic field is applied, so that it is transformed into the magnetic bubble domain, which is then detected by a magnetic bubble domain detecting means. After that, the application of the in-plane magnetic field is stopped.

Here, as the stripe magnetic domain chopping means, a hair-pin shaped conductor disposed in the direction perpendicular to that of the stretching of the stripe magnetic domain or two conductors parallel to each other are used. Further, as the magnetic bubble domain detecting means, e.g. a magnetic bubble domain detector utilizing the magneto-resistive effect by means of soft magnetic materials is known.

Consider now the case where there are no pair of Bloch lines at the head portion of the stripe magnetic domain. In this case, even if the sides of the domain wall are brought closer to each other by a pulsed bias magnetic field given by the stripe magnetic domain chopping means, since the directions of magnetization of the upper and the lower side of the domain wall are opposite to each other, the stripe magnetic domain is not chopped.

As stated above, the presence or absence of the pair of Bloch lines at the head portion of the stripe magnetic domain corresponds to whether the stripe magnetic domain is chopped or not and in turn whether it is transformed into the magnetic bubble domain or not. Consequently, according to this invention, it is possible to realize a practical Bloch line memory device.

DESCRIPTION OF THE PREFERRED EMBODIMENTS

Hereinbelow an embodiment of this invention will be explained, referring to FIG. 4.

The basic structure of the Bloch line memory consists of a stripe magnetic domain stabilizing pattern 11 and a stripe magnetic domain 2.

In this embodiment a pattern formed by scooping a magnetic film about 1 $\mu$m thick is used as means for stabilizing stripe magnetic domains.

Pairs of Bloch lines (or Bloch lines) can move freely in the domain wall. Two methods are conceived for shifting these pairs of Bloch lines. One of them is a method, by which a magnetic field perpendicular to the surface of the film is applied thereto, and a gyroscopic force acting on the magnetization is utilized. The other is a method, by which an in-plane magnetic field parallel to the plane, where the magnetic film exists, is utilized. The pairs of Bloch lines are freely shifted by either one of the methods. However, in order to utilize the Bloch lines as memorized information, it is necessary to stabilize a pair of Bloch lines at a particular address position, corresponding to the propagation period. In this first embodiment a pattern 9 indicated in FIG. 4 is used as this means.

A pattern fabricated by photoetching an in-plane magnetized film of $4\pi Ms = 1000$ G (Gauss) is used as the pattern 9 holding the Bloch lines.

Figure 4A:
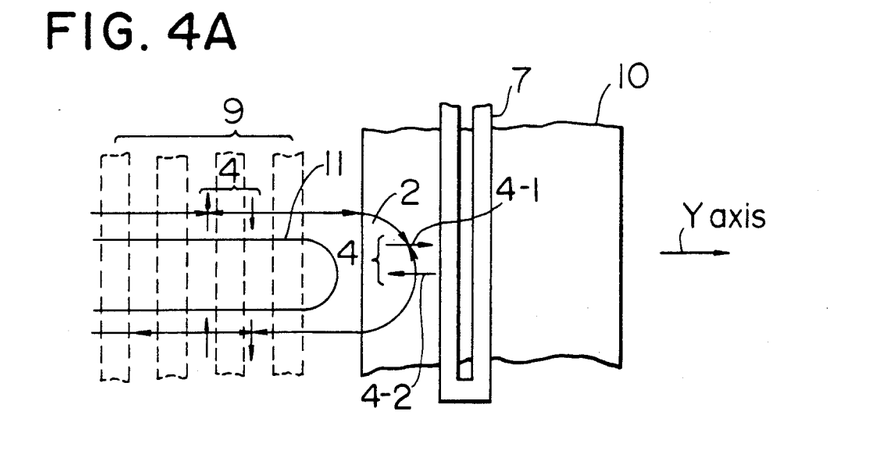
FIGS. 4A, 4B, 4C, 5A, 5B, 5C, 6A, 6B, 6C, 7A, 7B, 7C are schemes for explaining the principle for transforming the presence or absence of the pair of Bloch lines into the presence or absence of the magnetic bubble domain, concerning a first embodiment of this invention.

FIG. 4A shows the state before the reading-out.

A pair of Bloch lines 4 (4-1 and 4-2) is located at the head portion having a curvature of a stripe magnetic domain 2.

This corresponds to a case where information "1" is transferred towards the head.

Figure 4B:
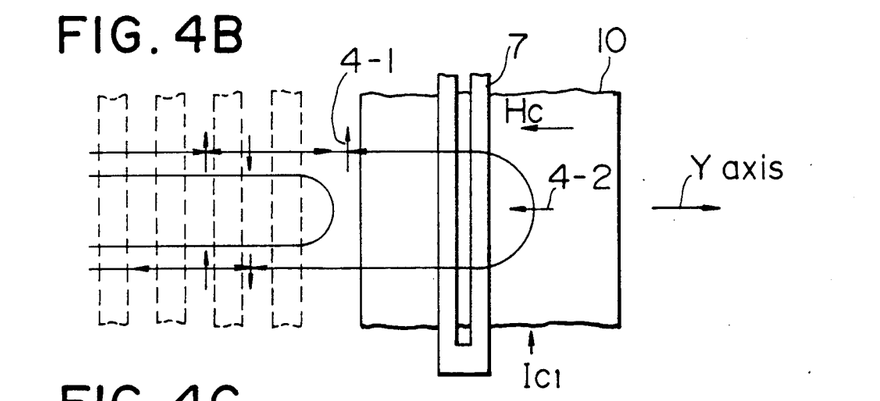

Then, an electric current $I_{cl}$ is allowed to flow through a conductor 10, as indicated in FIG. 4B, in order to generate a strong in-plane magnetic field $H_c$ in the $-Y$ axis direction. At this moment the interval between Bloch lines 4-1 and 4-2 is enlarged.

This behavior can be explained by the fact that the magnetization reacts on the in-plane magnetic field, as stated previously, and behaves so as to reduce the energy in the domain wall.

One 4-1 of the split Bloch lines is moved to the exterior of a conductor 10 by the magnetic field generated by the conductor 10.

The other Bloch line 4-2 is located stably at the head portion of the stripe magnetic domain.

This separation takes different periods of time, depending on the propagated distance of the Bloch lines. Usually, supposing that the conductor 5 is about 40 $\mu$m wide, it takes about 500 nano sec.

Figure 4C:
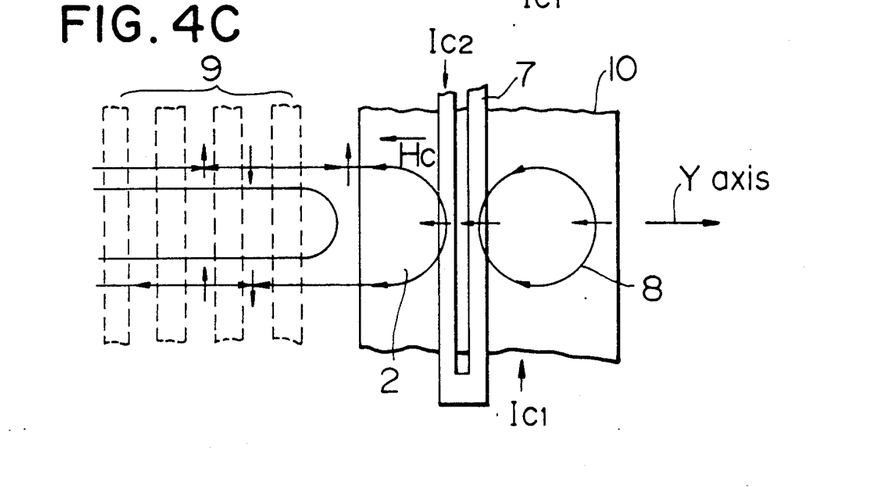

After that, when a predetermined electric current is allowed to flow through a conductor 7 indicated in FIG. 4C, the magnetic domain is easily chopped and a new magnetic domain 8 is cut out.

The chopped magnetic domain 8 is detected by a method identical to that of the usual bubble memory techniques and thus the presence of the pair of Bloch lines can be read-out as digital data.

Figure 5A:
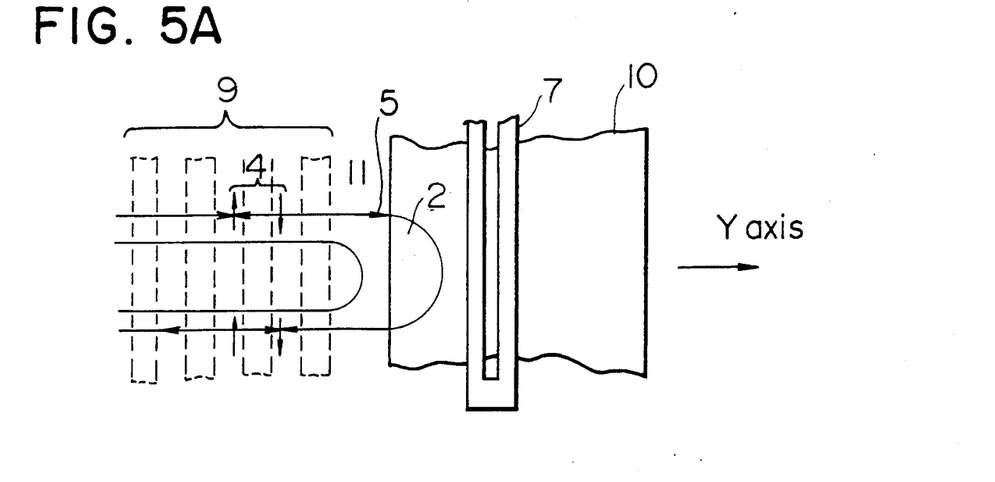

The matter stated above represents the case where "1" bit information is transferred towards the head portion. In the case where no Bloch lines are transferred towards the head portion, i.e. so-called "0" information, the pair of Bloch lines 4 indicated in FIGS. 4A, 4B and 4C do not exist. This aspect is shown in FIGS. 5A, 5B and 5C.

In the case where a conductor is disposed at the proximity of the head portion of the stripe magnetic domain (FIG. 5A) and in the case where an electric current $I_{cl}$ flows through the conductor (FIG. 5B), there are no differences in the movement of the stripe magnetic domain 2.

Figure 5B:
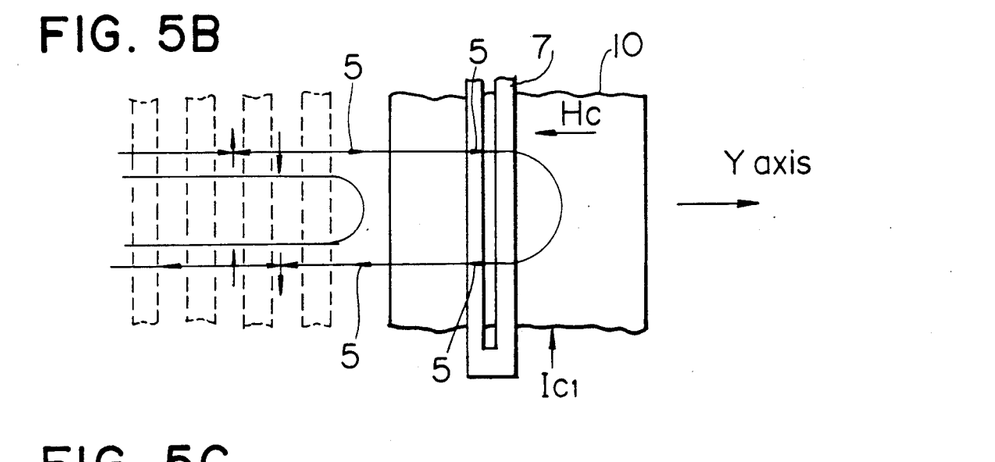
Figure 5C:
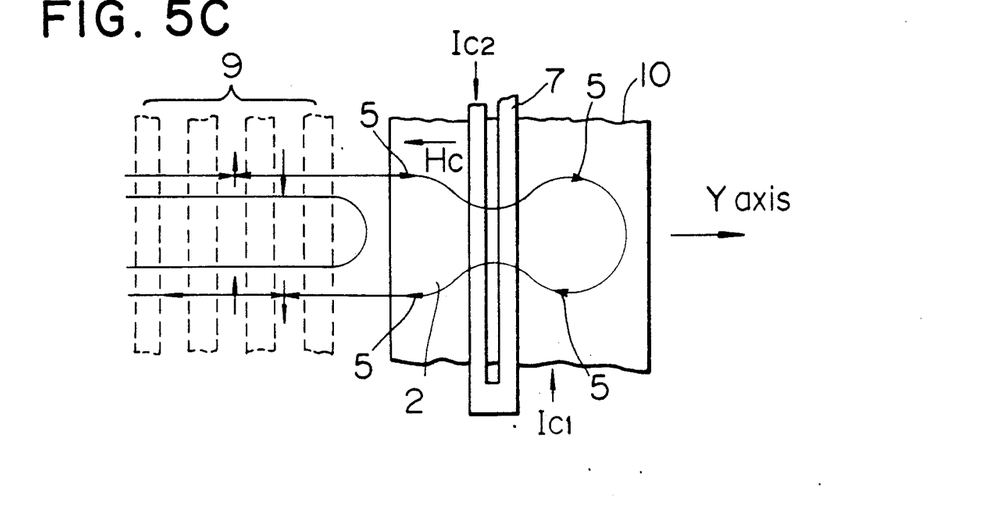

Since there are no Bloch lines at the proximity of the head portion of the stripe magnetic domain, the magnetization 5 has different directions at the upper and the lower sides of the domain wall of the stripe magnetic domain, as indicated in FIG. 5B. In such a state it is difficult to chop the magnetic domain and no magnetic domain is chopped as shown in FIG. 5C, if a chopping current $I_{c2}$ is chosen.

When this is detected by a method identical to that of the magnetic bubble techniques stated above, it is read-out that there are no pair of Bloch lines at the head portion of the stripe magnetic domain.

By the method described above it can be detected whether a pair of Bloch lines exist at the head portion of the stripe magnetic domain or not, i.e. which information exists, "1" or "0".

In the embodiment described above a conductor 10, 40 μm wide, was used as means generating the in-plane magnetic field for splitting the pair of Bloch lines. The width of this conductor is so chosen that the in-plane magnetic field is generated with a high efficiency and usually it is thought that it is suitably from several to about 100 times as wide as the stripe magnetic domain. When it is still wider, the effective area of the device is reduced and thus it is not efficacious. To the contrary, when it is narrower than that, it is not desirable for generating the in-plane magnetic field with a high efficiency.

As means for applying the in-plane magnetic field in the minus Y axis direction, a method using a high coercive force material magnetized in the in-plane direction is known, apart from the method using the conductor.

Figure 6A:
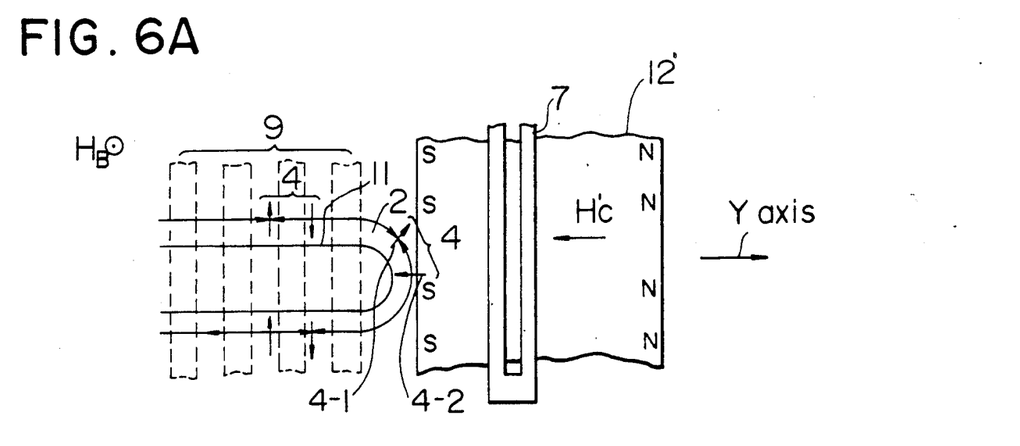
Figure 6B:
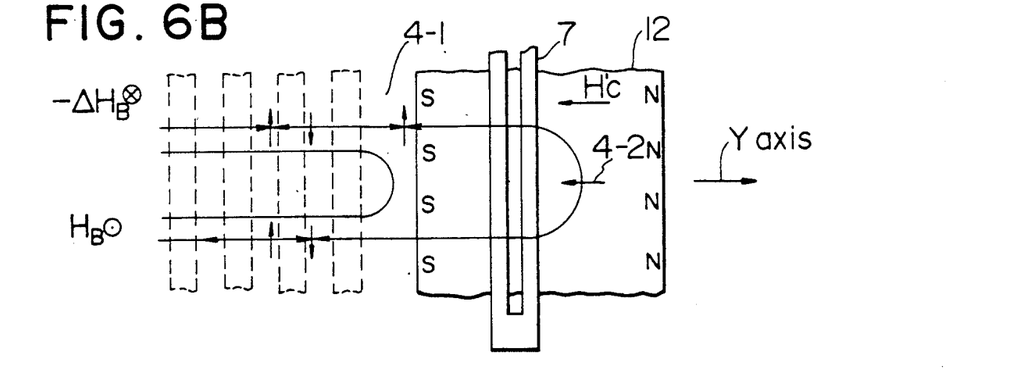
Figure 6C:
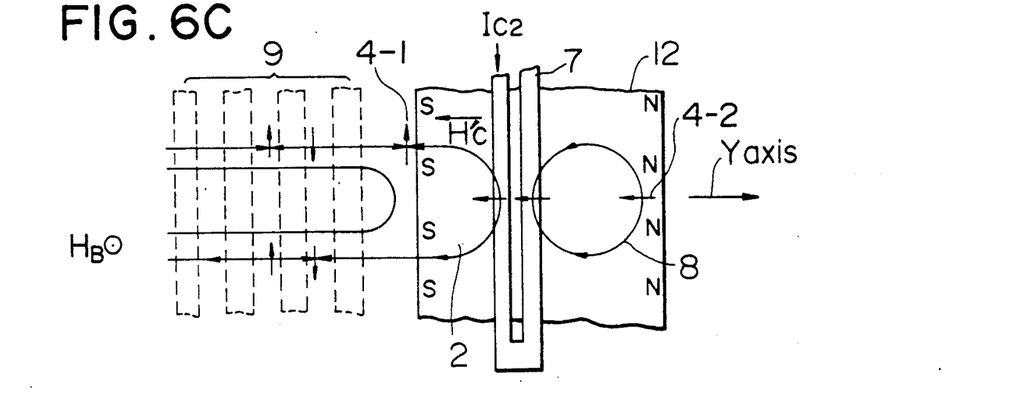

A high coercive force film magnetized in the in-plane direction generates a stray in-plane magnetic field in the in-plane direction. When the direction of this stray magnetic field and the direction of the magnetization between the pair of Bloch lines to be split are in accordance with each other, the pair of Bloch lines are split and thus it becomes possible to read-out them. FIGS. 6A, 6B and 6C indicate this structure. A pattern made of Tb-Fe-Co, etc. having its axis of easy magnetization in the in-plane direction (hereinbelow called in-plane magnetization film pattern) is disposed at the proximity of the head portion of the stripe magnetic domain. When the magnetization direction of the in-plane magnetization film is rightward, as indicated by S and N poles in FIG. 6A, the in-plane magnetic field leaking out from the in-plane magnetization film has the direction $H_c'$. After that, the head portion of the stripe magnetic domain is stretched by applying a magnetic field $-\Delta H_B$, which is opposite to the vertical bias magnetic field $H_B$, as indicated in FIG. 6B. At this time, when a pair of Bloch lines exist at the head portion of the stripe magnetic domain, the pair of Bloch lines are split, sensing the in-plane magnetic field, and thus it becomes possible to read-out them as shown in FIG. 6C, just as in the case where the conductor is used in the same manner, as described above.

Figure 7A:
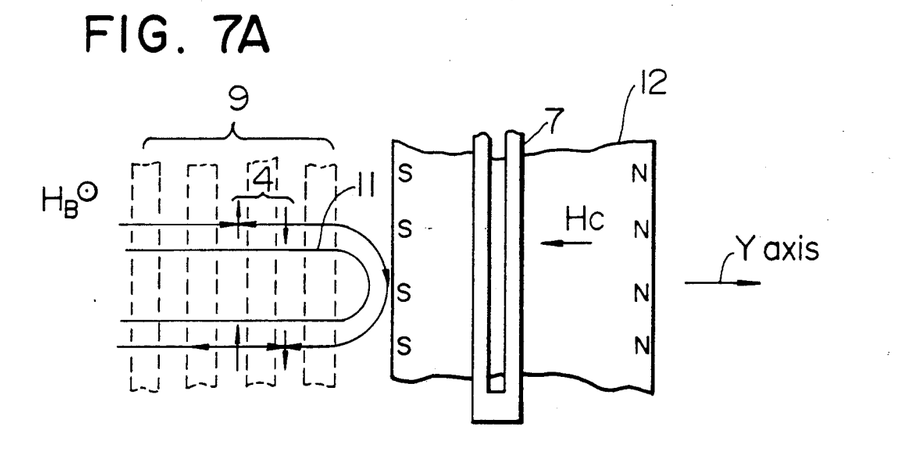
Figure 7B:
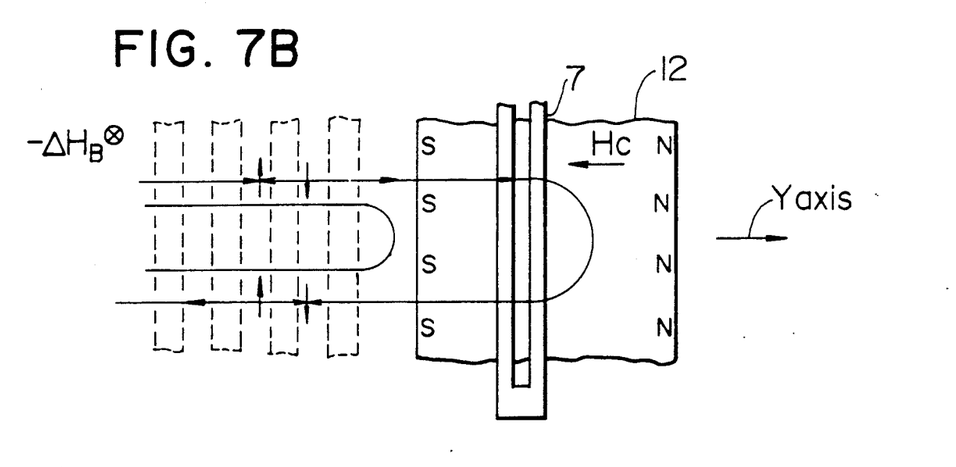
Figure 7C:
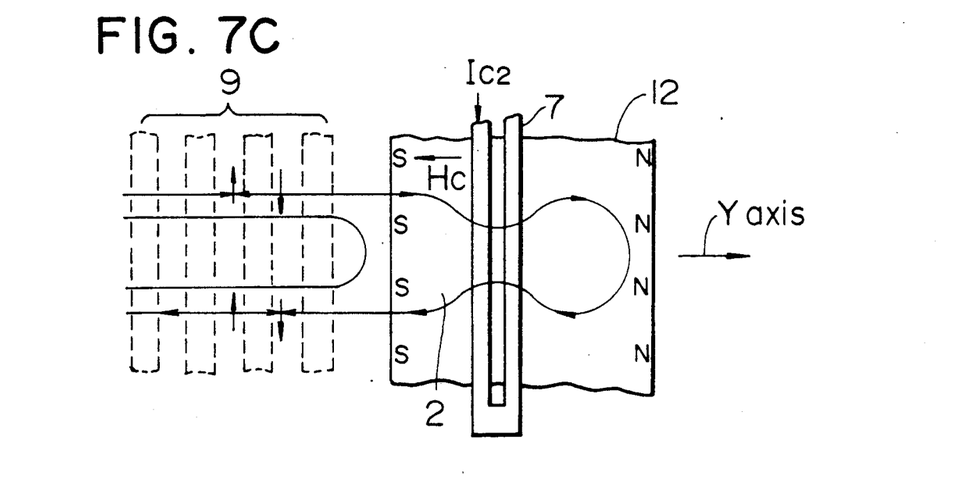

In the state, where there are no pair of Bloch lines, as indicated in FIG. 7A, for the reason stated previously, no magnetic domain is chopped. In other words, even when a magnetic field $-\Delta H_B$ is applied to stretch a stripe magnetic domain as indicated in FIG. 7B from the state of FIG. 7A, the stripe magnetic domain is difficult to chop unless there are Bloch lines at the head portion of the stripe magnetic domain. Thus, the stripe magnetic domain is not chopped even by applying a current $I_C$ to the conductor 7C, and hence, a bubble domain is not chopped.

Now the second embodiment of this invention will be explained.

Figure 8A:
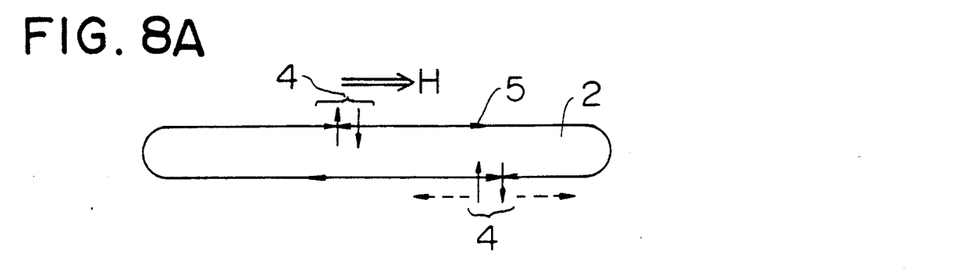
FIGS. 8A, 8B, 8C and 8D are schemes showing the relation between the pair of Bloch lines and the in-plane magnetic field and the fact that the pair of Bloch lines are held stably at a predetermined position.
Figure 8B:
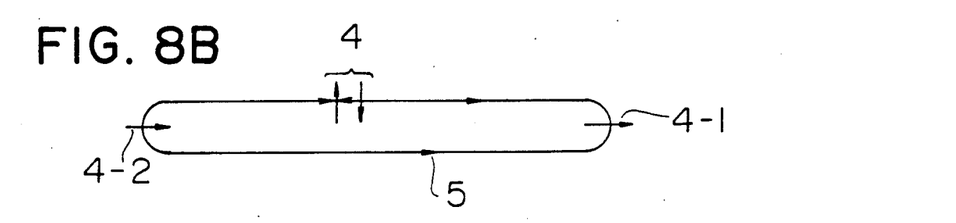

In this embodiment the magnetization structure of the stripe magnetic domain differs from that stated in embodiment 1. FIG. 8A indicates the stripe magnetic domain 2. Two pairs of Bloch lines 4 exist on the periphery of one stripe magnetic domain 2. The directions of the magnetizations between the pairs of Bloch lines are opposite to each other. As it is clearly seen from FIG. 1, this is because the magnetizations rotate continuously along the domain wall. Under this state, as indicated in FIG. 8A, when a magnetic field H having the same direction as that of the magnetization in the region comprised between the pair of Bloch lines existing at the lower side of the domain wall is applied, the lower pair of Bloch lines are split and move to the two head portions of the stripe magnetic domain. For this reason, the information, which this pair of Bloch lines has disappears (FIG. 8B).

Figure 8C:
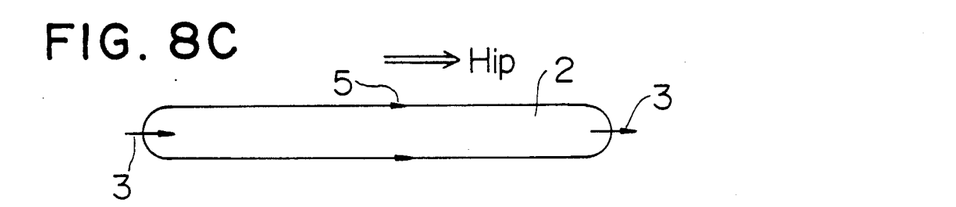
Figure 8D:
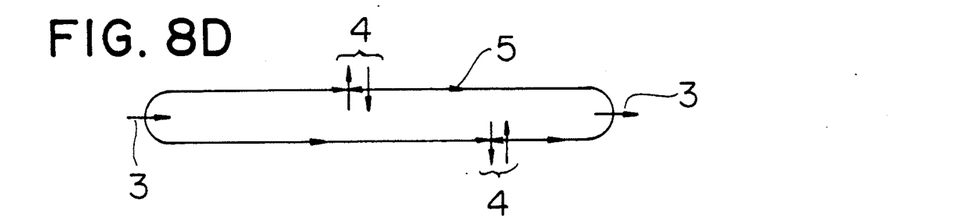

In order to resolve this problem, it is proposed that one Bloch line is located at each of the head portions. FIG. 8C indicates this aspect. As indicated in this figure, when one Bloch line is located at each of the two head portions of the stripe magnetic domain 2 and when an in-plane magnetic field Hip is applied thereto, since the magnetization of the domain wall of the stripe magnetic domain has the same direction as that of the magnetic field Hip at both the sides, the Bloch lines 3 can exist stably at both the head portions. Under this state, when the pair of Bloch lines are written-in, owing to the continuity of the magnetization direction described above, the magnetization between the pair of Bloch lines is always opposite to that of the magnetic field Hip (FIG. 8D). For this reason, whether the pair of Bloch lines exist at the side, upper or lower, of the domain wall, they are not split and can exist stably.

Figure 9A:
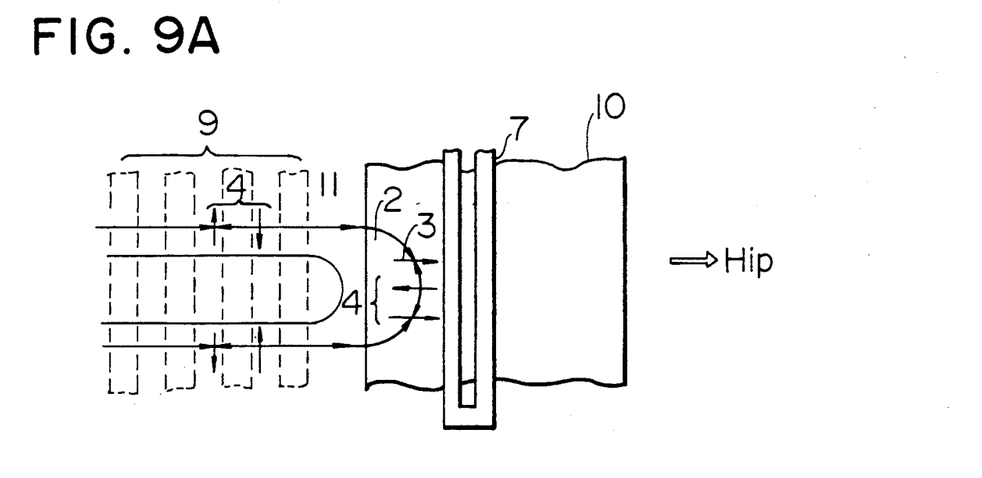
FIGS. 9A, 9B, 9C, 10A, 10B and 10C are schemes for explaining the principle for transforming the presence or absence of the pair of Bloch lines into the presence or absence of the magnetic bubble domain, concerning a second embodiment of this invention.
Figure 9B:
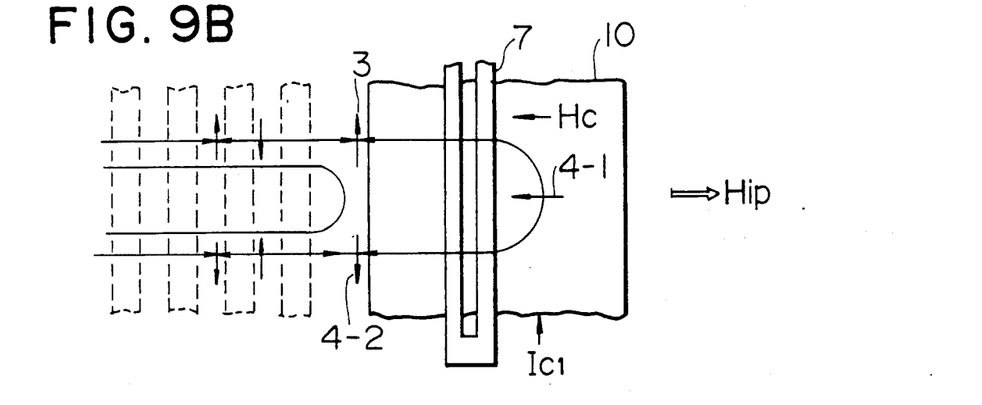
Figure 9C:
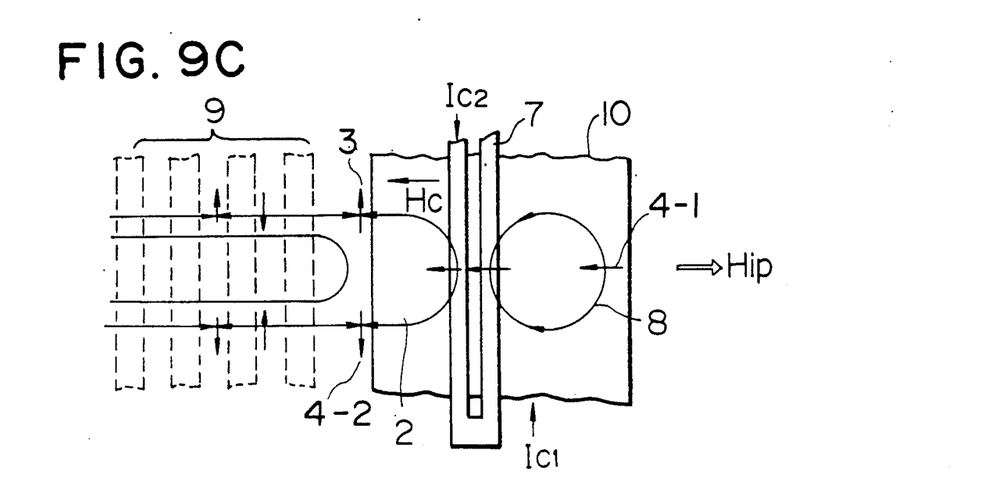

A method for reading-out information at the head portion of the stripe magnetic domain having this structure will be explained, referring to FIGS. 9A, 9B and 9C. FIG. 9A indicates the case where the same Bloch line 3 described above and a pair of Bloch lines 4 corresponding to an information "1" exist at the head portion of the stripe magnetic domain. After that, when an electric current $I_{cl}$ is made to flow through the conductor 10 just as in a first embodiment of the present invention, the pair of Bloch lines are split into 4-1 and 4-2. At this time, since the region of the domain wall between the Bloch line 3 and the pair of Bloch lines 4 is enlarged, as indicated in FIG. 9B, three Bloch lines are respectively located stably at the head portion of the stripe magnetic domain and at the head portion of the conductor. Then, when a chopping operation is effected at the extremity of the stripe magnetic domain, since the directions of the upper and lower side of the domain wall are in the direction, a bubble 8 is chopped as shown in FIG. 9C.

Figure 10A:
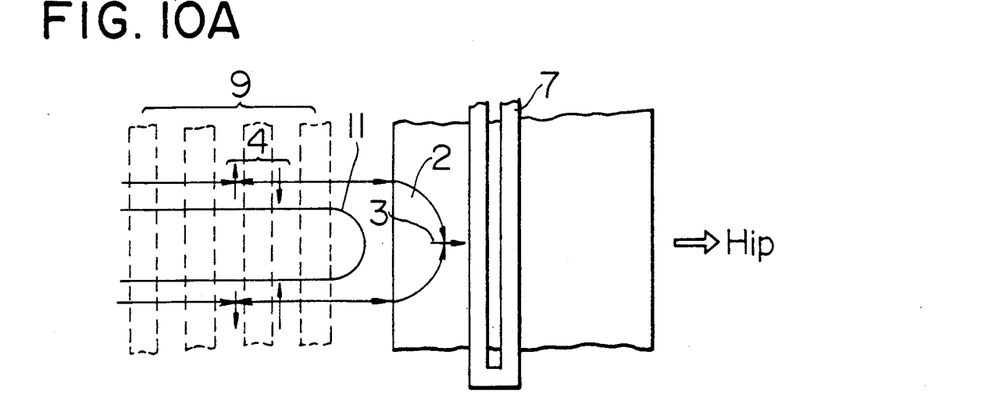
Figure 10B:
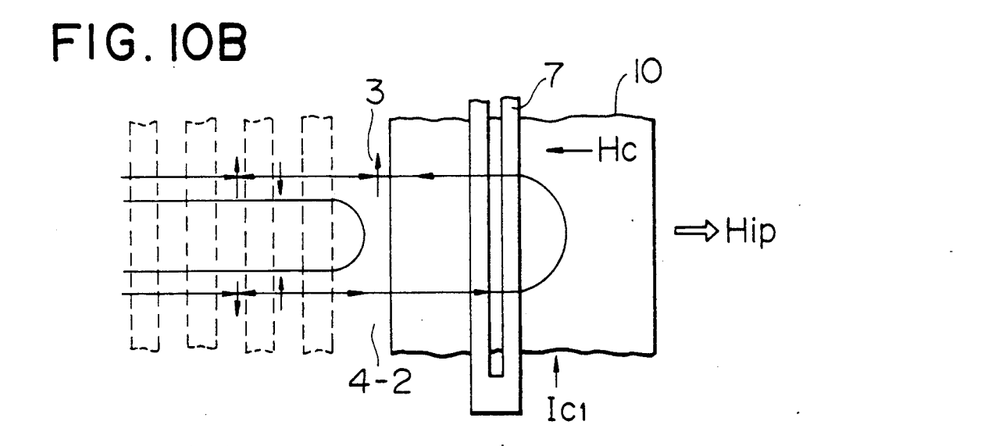
Figure 10C:
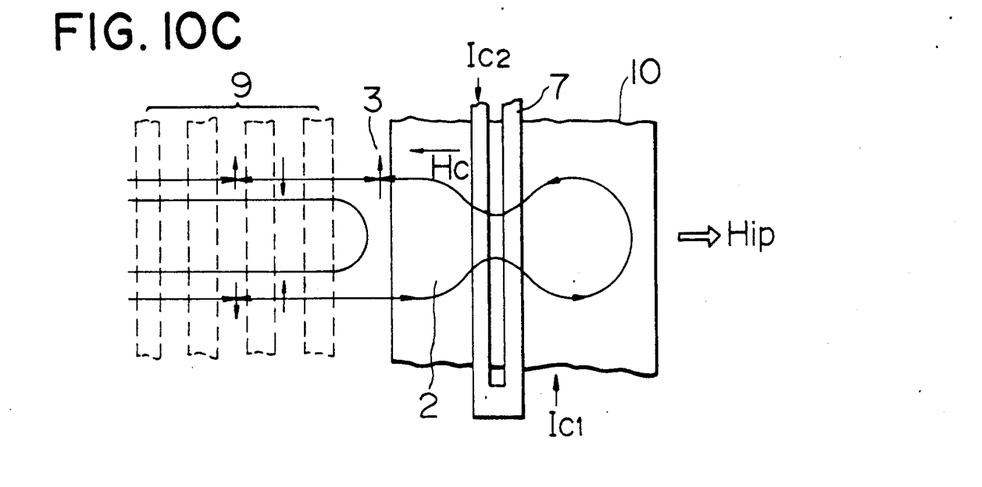

On the other hand, the case of an information "0" will be explained, referring to FIGS. 10A, 10B and 10C. FIG. 10A indicates the state, where only the Bloch line 3 exists at the head portion of the stripe magnetic domain. After that, when the electric current $I_{cl}$ is made to flow through the conductor 10, the Bloch line 3 is shifted to the position indicated in FIG. 10B. At this time, regardless of whether the Bloch line 3 shifted along the upper or lower side of the domain wall, the magnetizations of the domain wall after the shift are opposite to each other at the upper and lower sides of the domain wall. Therefore, even by the chopping operation indicated in FIG. 10C, no magnetic domain is chopped. Consequently reading-out the information is realized by detecting the presence or absence of the chopped magnetic domain by using means identical to that according to the prior art techniques, just as in Embodiment 1.

As explained above, according to this invention, it is possible to realize reading-out information in a Bloch line memory, in which one bit information corresponds to one pair of Bloch lines.

What is claimed is:

1. A method for operating a Bloch line memory device comprising the following steps:
   (1) a step of preparing a high coercive force film having a predetermined width on a magnetic medium film;
   (2) a step of holding a stripe magnetic domain including at least one pair of Bloch lines at a desired region of a magnetic medium film;
   (3) a step of stretching a head portion of said stripe magnetic domain on said high coercive force film and at the same time splitting the pair of Bloch lines by applying a magnetic force in a direction opposite to a vertical bias magnetic field perpendicular to a plane where said magnetic medium film exists in a state, wherein an in-plane magnetic field generated by said high coercive force film is applied in a plane parallel to that where said magnetic medium film exists;
   (4) a step of transforming a Bloch line existing at the head portion of said stripe magnetic domain by bringing upper and the lower sides of the domain wall of said stripe magnetic domain closer to each other by means of a stripe magnetic domain chopping means into a magnetic bubble domain; and
   (5) a step of stopping the applying of said magnetic force in the direction opposite to a vertical bias magnetic field.

2. A method for operating a Bloch line memory device according to claim 1, wherein a direction of said in-plane magnetic field is approximately parallel and opposite to a stretching direction of said stripe magnetic domain.

3. A method for operating a Block line memory device according to claim 1, wherein said in-plane magnetic field is a leakage magnetic field generated by said high coercive force film disposed proximate to the head portion of said stripe magnetic domain.

4. A method for operating a Bloch line memory device according to claim 1, wherein a Bloch line is located at each of two head portions of said stripe magnetic domain.

5. A method for operating a Bloch line memory device according to claim 1, wherein said stripe magnetic domain chopping means is a hair-pin shaped conductor disposed in a direction approximately perpendicular to a stretching direction of said stripe magnetic domain.

6. A Bloch line memory device comprising:
   a high coercive force film having a predetermined width on a magnetic medium film;
   means for holding a stripe magnetic domain including at least one pair of Bloch lines at a desired region of the magnetic medium film;
   means for stretching a head portion of the stripe magnetic domain on the high coercive force film and for simultaneously splitting the pair of Bloch lines by applying a magnetic force in a direction opposite to a vertical bias magnetic field perpendicular to a plane where the magnetic medium film exists in a state, where an in-plane magnetic field generated by the high coercive force film is applied in a plane parallel to that where the magnetic medium film exists;
   means for transforming a Bloch line existing at the head portion of the stripe magnetic domain by bringing upper and lower sides of a domain wall of the stripe magnetic domain closer to each other and for chopping the stripe magnetic domain; and
   means for stopping the applying of the magnetic force in the direction opposite to the vertical bias magnetic field.

7. A Bloch line memory device according to claim 6, wherein a direction of the in-plane magnetic field is approximately parallel and opposite to a direction of stretching of the stripe magnetic domain as effected by the stretching means.

8. A Bloch line memory device according to claim 6, wherein the in-plane magnetic field is a leakage magnetic field generated by the high coercive force film disposed proximate to the head portion of the stripe magnetic domain.

9. A Bloch line memory device according to claim 6, wherein a Bloch line is located a each of two head portions of the stripe magnetic domain.

10. A Bloch line memory device according to claim 6, wherein the transforming means for enabling chopping of the stripe magnetic domain includes a hair-pin shaped conductor disposed in a direction approximately perpendicular to a direction of stretching of the stripe magnetic domain as effected by the stretching means.

11. A Bloch line memory device comprising:
    a magnetic medium film;
    means for holding a stripe magnetic domain including at least one pair of Bloch lines at a desired region of the magnetic medium film;
    means for applying an in-plane magnetic field to the magnetic medium film;
    means for simultaneously stretching a head portion of the stripe magnetic domain on the means for applying the in-plane magnetic field to the magnetic medium film by applying a magnetic force in a direction opposite to a vertical bias magnetic field perpendicular to the film plane and for splitting the pair of Bloch lines by applying the in-plane magnetic field provided by the means for applying the in-plane magnetic field in a plane parallel to that where the magnetic medium film exists; and
    means for chopping the stripe magnetic domain at the head portion of the stripe magnetic domain by bringing upper and lower sides of a domain wall of the stripe magnetic domain closer to each other.

12. A Bloch line memory device according to claim 11, wherein the means for applying is a conductor having a predetermined width, the conductor being disposed on the magnetic medium film so that it is superimposed on the stripe magnetic domain.

13. A Bloch line memory device according to claim 11, wherein the means for applying is a high coercive force film.

14. A Bloch line memory device according to claim 11, wherein the magnetic medium film is a magnetic garnet film.

15. A Block line memory device according to claim 11, further comprising magnetic bubble domain detecting means for detecting a magnetic bubble domain chopped by the means for chopping.

16. A Bloch line memory device according to claim 11, wherein the means for chopping is a hair-pin shaped conductor disposed in a direction approximately perpendicular to a stretching direction of the stripe magnetic domain.

* * * * *